United States Patent [19]

Nakatani et al.

[11] Patent Number: 5,395,739

[45] Date of Patent: Mar. 7, 1995

[54] METHOD FOR PRODUCING FIELD EFFECT TRANSISTOR

[75] Inventors: Mitsunori Nakatani; Yoshiki Kojima; Hiroyuki Minami, all of Itami, Japan

[73] Assignee: Mitsubishi Denki Kabushiki Kaisha, Tokyo, Japan

[21] Appl. No.: 142,860

[22] Filed: Oct. 28, 1993

[30] Foreign Application Priority Data

Dec. 15, 1992 [JP] Japan .................. 4-354580

[51] Int. Cl.6 .............................. G03C 5/00
[52] U.S. Cl. .................. 430/311; 430/312; 430/314; 430/319
[58] Field of Search ............ 430/312, 314, 316, 319, 430/313, 311

[56] References Cited

U.S. PATENT DOCUMENTS 4,687,730  8/1987  Eron ........................... 430/324

FOREIGN PATENT DOCUMENTS

| 120834 | 2/1984 | European Pat. Off. |
| 293643 | 5/1988 | European Pat. Off. |
| 490547 | 11/1991 | European Pat. Off. |
| 61-156887 | 7/1986 | Japan |
| 1-86564 | 3/1989 | Japan |
| 64-86564 | 3/1989 | Japan |
| 1-175772 | 7/1989 | Japan |
| 2-25039 | 1/1990 | Japan |
| 2-267945 | 11/1990 | Japan |
| 1-83977 | 3/1991 | Japan |
| 3-145738 | 6/1991 | Japan |
| 3-293733 | 12/1991 | Japan |
| 551183 | 2/1943 | United Kingdom |
| 867559 | 5/1961 | United Kingdom |

Primary Examiner—S. Rosasco
Attorney, Agent, or Firm—Leydig, Voit & Mayer

[57] ABSTRACT

In a method for producing a field effect transistor, a positive photoresist is deposited on a surface of a semiconductor substrate, the positive photoresist is exposed to light having an asymmetric intensity profile where a gate electrode is to be formed, the positive photoresist is converted into a negative photoresist, the negative photoresist is developed to form a pattern having an aperture opposite the gate electrode formation region of the substrate and asymmetric overhanging portions at the aperture, the semiconductor substrate is wet etched using the photoresist pattern as a mask to form a recess in the semiconductor substrate, and a gate metal is deposited using the photoresist pattern as a mask to form a gate electrode in the recess. Therefore, only one exposure process provides a photoresist pattern having asymmetric overhanging portions at the aperture of the pattern.

5 Claims, 8 Drawing Sheets

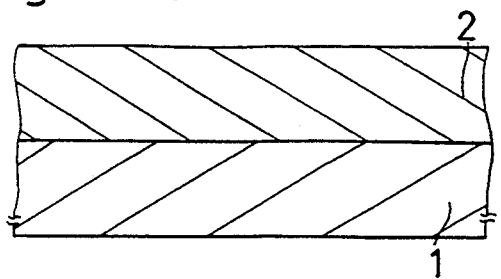
Fig. 8 (a)
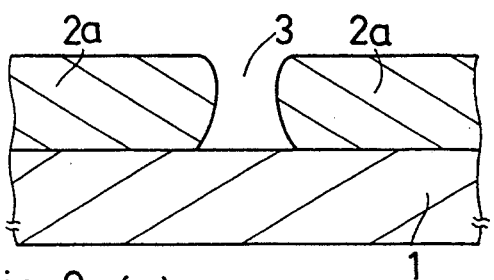
Fig. 8 (b)
Fig. 8 (c)
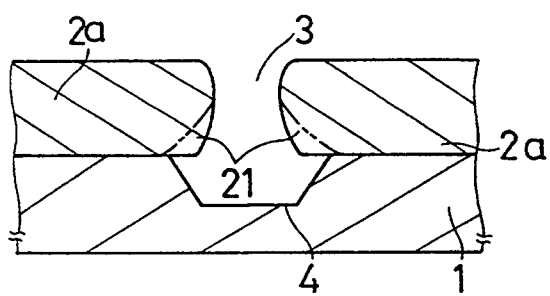
Fig. 8 (d)
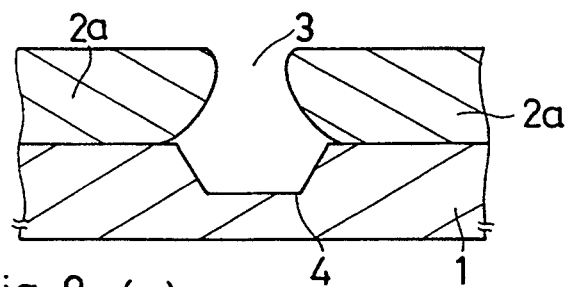
Fig. 8 (e)
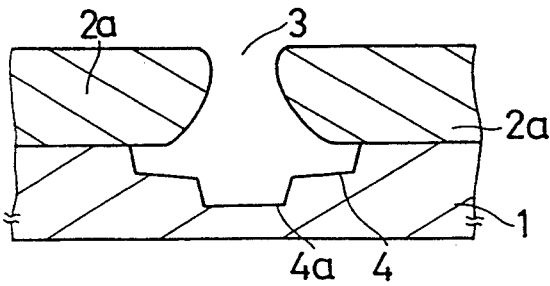
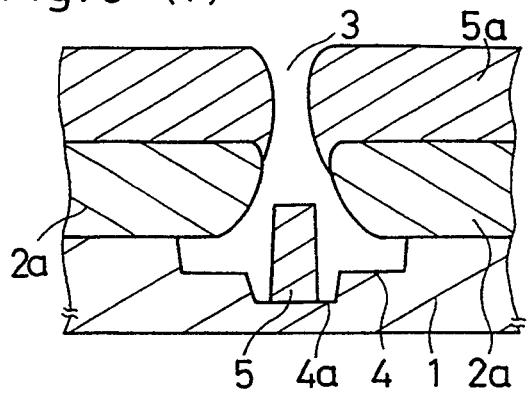
Fig. 8 (f)
Fig. 8 (g)
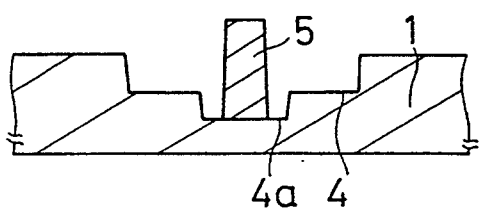

METHOD FOR PRODUCING FIELD EFFECT TRANSISTOR

FIELD OF THE INVENTION

The present invention relates to a method for producing a field effect transistor (hereinafter referred to as FET) and, more particularly, to a method for producing a recessed gate using an asymmetric mask pattern. The invention also relates to a pattern transfer mask used for forming the asymmetric mask pattern.

BACKGROUND OF THE INVENTION

FIGS. 9(a) to 9(f) are sectional views illustrating process steps in a prior art method for producing an FET.

Initially, an image reversal photoresist film 2 about 0.6 μm thick is deposited on a semi-insulating GaAs substrate 1 about 600 μm thick including an active region (not shown) about 5000 Å thick (FIG. 9(a)).

Using a mask shown in FIGS. 10(a)–10(b), the photoresist film 2 is selectively exposed to light having a wavelength of 0.3~0.4 μm (first exposure step), preferably by a conventional photolithographic technique. Then, the photoresist film 2 is subjected to a reversal baking process and a whole surface exposure (second exposure step), whereby a part of the photoresist film 2 which is not exposed to light during the first exposure step is soluble. This soluble part is removed during development, resulting in a photoresist pattern 2a with an aperture 3 0.5~1 μm wide (FIG. 9(b)).

The image reversal process is a technique for producing a negative image using a positive photoresist. If a positive photoresist is exposed to light using the mask shown in FIGS. 10(a)–10(b), since the absorption of the exposed portion is highest in the vicinity of the surface and gradually decreases with the thickness of the photoresist film, a trapezoid photoresist pattern remains after development. However, if the positive photoresist is reversed to a negative photoresist after the exposure step, the exposed portion remains during the development, resulting in a photoresist pattern having a trapezoid aperture as shown in FIG. 9(b).

In the step of FIG. 9(c), the substrate is wet etched with a mixture of phosphoric acid and hydrogen peroxide or a mixture of tartaric acid and hydrogen peroxide using the photoresist pattern 2a as a mask (first recess etching), forming a first gate recess 4 (FIG. 9(c)). Preferably, the first gate recess 4 has a width of 1.4 μm and a depth of 3000 Å.

Thereafter, dry etching is carried out using the photoresist pattern 2a as a mask (second recess etching), forming a second gate recess 4a in the center of the bottom surface of the first gate recess 4 (FIG. 9(d)). Preferably, the second gate recess 4a has a width of 0.6 μm and a depth of 1000 Å.

A gate metal 5a, such as Al, Ti, or Au, is deposited in the direction perpendicular to the surface of the substrate 1 (FIG. 9(e)), and the photoresist pattern 2a and the overlying portions 5a of the gate metal are removed by a lift-off technique, resulting in a gate electrode 5 in the second recess 4a (FIG. 9(f)). Preferably, the gate length is 0.5 μm.

In the above-described Schottky-gate field effect transistor, i.e., metal semiconductor field effect transistor (hereinafter referred to as MESFET), the gate electrode disposed in the recess is not adversely affected by a surface depletion layer due to surface states, reducing the source resistance. In addition, the electric field concentration between the gate and the drain is relaxed, increasing the drain breakdown voltage.

An offset arrangement of the gate electrode in the recess has been well known as a technique for further improving the recessed gate structure. That is, the gate electrode is disposed in the recess toward the source electrode. In this case, since the space between the gate and the source is narrowed, the source resistance is reduced. On the other hand, since the space between the gate and the drain is widened, the drain breakdown voltage is increased.

However, the offset arrangement of the gate electrode is impossible in the process steps illustrated in FIGS. 9(a)–9(f). The reason will be described hereinafter.

FIGS. 10(a) and 10(b) illustrate a mask employed in the gate pattern transfer step in the above-described production process, in which FIG. 10(a) is a plan view of the mask and FIG. 10(b) is a sectional view taken along line B—B of FIG. 10(a). In the figures, reference numeral 6 designates a glass plate. A light shielding film 7 serving as a gate pattern transfer mask is disposed on a surface of the glass plate 6. Preferably, the light shielding film 7 is made of Cr. The light shielding film 7 includes a portion 7a corresponding to a gate finger (hereinafter referred to as gate finger portion). The width of the gate finger portion 7a is 2.5~5 μm. Reference numerals 6a and 6b designate portions of the glass plate 6 at opposite sides of the gate finger portion 7a. In this gate pattern transfer process, the reduction ratio of the gate pattern transfer mask is 1/5.

FIG. 10(c) illustrates an on-wafer intensity profile of light transmitted through the gate pattern transfer mask shown in FIGS. 10(a)–10(b) during the exposure process. As shown in FIG. 10(c), a symmetric profile with the gate finger portion 7a as the center of symmetry is attained. FIG. 10(d) illustrates the relation between the exposure energy of the exposure apparatus and the overhang of the image reversal photoresist pattern 2a in the aperture 3. As shown in FIG. 10(d), the overhang is approximately in inverse proportion to the exposure energy in a limited range of the exposure energy. An increase in the exposure energy increases the absorption at the lower part of the photoresist film 2 and decreases the overhang of the photoresist pattern 2a. That is, sufficient exposure energy produces almost vertical side surfaces of the photoresist pattern 2a in the aperture 3.

As described above, when the photoresist pattern of the gate electrode is formed using the pattern transfer mask with the symmetric light shielding film shown in FIG. 10(a), the photoresist pattern 2a with the symmetric overhanging portions in the aperture 3 is attained. Therefore, the offset arrangement of the gate electrode in the recess is impossible.

A variety of methods for the offset arrangement of the gate electrode have been proposed. Some of them will be described hereinafter.

In Japanese Published Patent Application No. 2-25039, a photoresist pattern for a gate electrode is formed on a substrate with an active region and source and drain electrodes, and wet etching is carried out after removing a portion of the photoresist pattern on the drain electrode. Since the etching rate on the drain electrode side is increased, the width of the recess on the drain electrode side is increased. In this method, however, it is difficult to control the etching rates in the perpendicular and transverse directions during wet etching and, therefore, the recess shape after wet etching unfavorably varies, resulting in a variation in the offset position of the gate electrode.

In Japanese Published Patent Application No. 64-86564, a photoresist film is deposited on a substrate having an active region and source and drain electrodes, and an Al film with an aperture of a prescribed width is formed on the photoresist film. Using the Al film as a mask, an energy beam is obliquely applied to the photoresist film, forming a photoresist pattern with asymmetric overhanging portions. Then, the substrate is selectively etched using the photoresist pattern as a mask, forming a gate recess having an asymmetric width with respect to the aperture of the Al film. In this method, however, the formation of the mask for the energy beam irradiation, i.e., the Al film with the aperture, complicates the production process. In addition, if a common drain structure is employed, the focusing of the exposure energy beam is difficult, resulting in a variation in the recess shape.

In Japanese Published Patent Applications Nos. 2-267945, 3-145738, and 3-293733, a mask pattern having asymmetric overhanging portions in its aperture is formed on a substrate using a plurality of materials, and the substrate is etched using the mask pattern to form a recess having an asymmetric width with respect to the aperture of the mask. In this method, however, the mask formation process is complicated and the precision in forming the overhanging portions in the aperture of the mask is poor.

In the above-described prior art methods for offset-arranging the gate electrode in the recess, the recess etching is not controlled with high precision. In addition, the offset position of the gate electrode in the recess unfavorably varies due to the increased and complicated process steps.

SUMMARY OF THE INVENTION

An object of the present invention is to provide a method for producing an FET in which an asymmetric photoresist mask pattern for forming a gate electrode is formed in a relatively simple process and the gate electrode is produced with high stability.

Another object of the present invention is to provide a pattern transfer mask for forming the asymmetric photoresist pattern.

Still another object of the present invention is to provide a relatively simple method for producing a MESFET without using an asymmetric pattern transfer mask, in which the breakdown voltage of the MESFET is increased and a gate electrode is formed with high stability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a method for producing a field effect transistor, a positive photoresist is deposited on a surface of a semiconductor substrate, the positive photoresist is exposed to light having an asymmetric intensity profile with a region of the semiconductor substrate where a gate electrode is to be formed as a center of asymmetry, the positive photoresist is converted into a negative photoresist, the negative photoresist is developed to form a pattern having an aperture opposite the gate electrode formation region of the substrate and asymmetric overhanging portions in the aperture, the semiconductor substrate is wet etched using the photoresist pattern as a mask to form a first recess in the semiconductor substrate, and a gate metal is deposited using the photoresist pattern as a mask to form a gate electrode in the first recess. Therefore, only one exposure process provides the photoresist pattern having asymmetric overhanging portions in the aperture of the pattern.

According to a second aspect of the present invention, a pattern transfer mask comprises a transparent substrate, a linear light shielding film pattern disposed on the transparent substrate, and means for reducing the intensity of light transmitted through a part of the mask on either side of the light shielding film pattern. Therefore, the light applied through the mask to the surface of the photoresist film has an asymmetric intensity profile with the gate electrode formation region as the center of asymmetry.

According to a third aspect of the present invention, in a method for producing a field effect transistor, a positive photoresist is deposited on a surface of a semiconductor substrate, a region of the positive photoresist film opposite a region of the substrate where a gate electrode is to be formed is exposed to light, the positive photoresist is converted into a negative photoresist, the negative photoresist is developed to form a pattern having an aperture opposite the gate electrode formation region of the substrate and symmetric overhanging portions in the aperture, the semiconductor substrate is wet etched using the photoresist pattern as a mask to form a first recess in the semiconductor substrate, the photoresist pattern is developed to increase the overhanging portions in the aperture, the semiconductor substrate is wet etched using the photoresist pattern with the increased overhanging portions as a mask to increase the width of the first recess and to form a second recess in the first recess, and a gate metal is deposited using the photoresist pattern as a mask to form a gate electrode in the second recess. Therefore, the width of the recess is increased in the relatively simple method.

BRIEF DESCRIPTION OF THE DRAWINGS

FIGS. 8(a)–8(g) are sectional views illustrating process steps in a method for producing an FET in accordance with a seventh embodiment of the present invention.

DETAILED DESCRIPTION OF THE PREFERRED EMBODIMENTS

Figure 1:
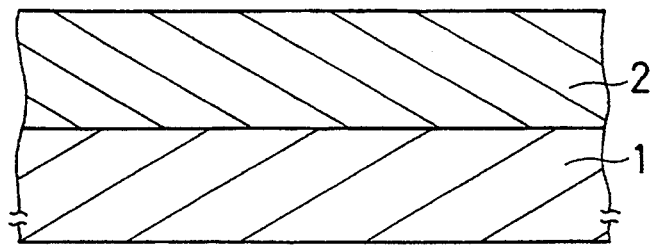
FIGS. 1(a)-1(e) are sectional views illustrating process steps in a method for producing an FET in accordance with a first embodiment of the present invention.
Figure 1:
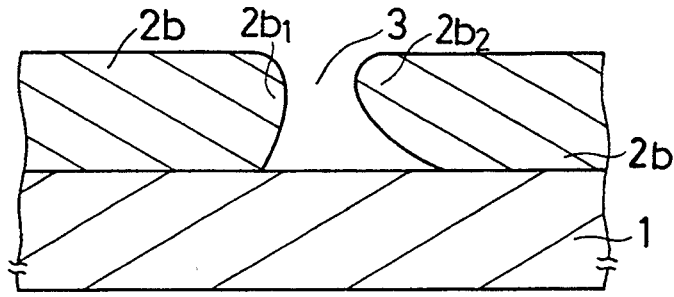
Figure 1:
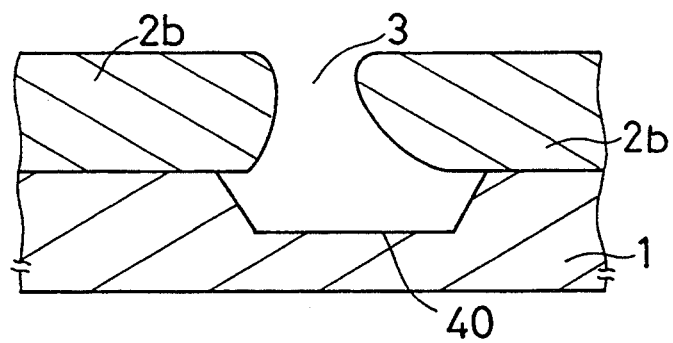
Figure 1:
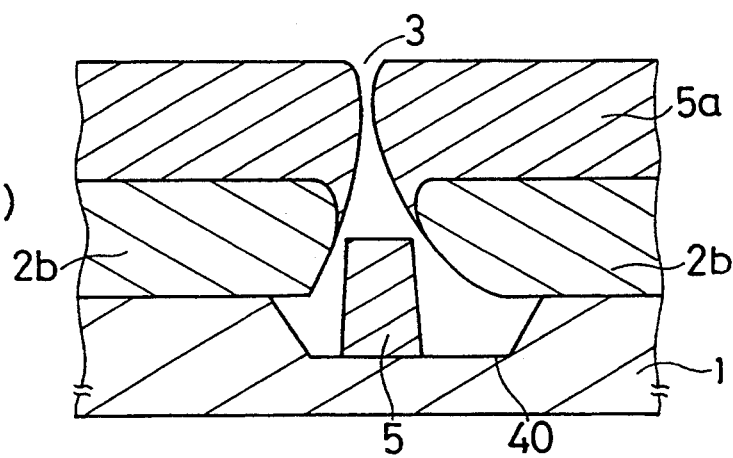
Figure 1:
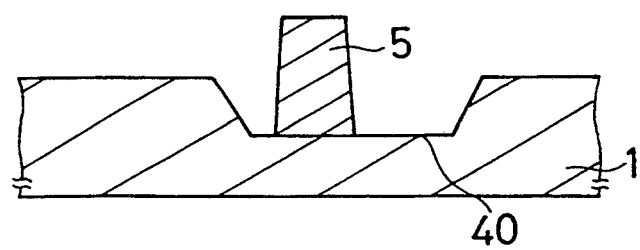

FIGS. 1(a)–1(e) are sectional views illustrating process steps in a method for producing an FET in accordance with a first embodiment of the present invention. FIGS. 2(a) and 2(b) are a plan view and a sectional view illustrating a gate pattern transfer mask used in the production of the FET, and FIG. 2(c) illustrates an on-wafer intensity profile of light transmitted through the mask of FIGS. 2(a)–2(b). In this first embodiment of the present invention, the overhanging portion $2b_2$ of the photoresist pattern 2b on the right side of the aperture 3 is larger than the overhanging portion $2b_1$ on the left side of the aperture 3, the gate recess 40 is wider than the gate recess 4 shown in FIG. 9(c).

In FIG. 2(a), the light shielding film 7 has a plurality of projections 7b on one side of the gate finger portion 7a. The space between adjacent projections is about 1 μm and the width of each projection is about 1 μm. The reduction ratio of the gate pattern transfer mask is 1/5.

A description is given of the production method.

Figure 2:
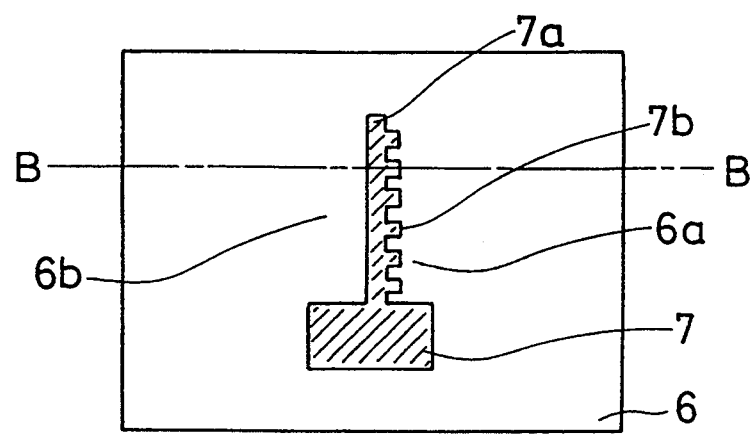
FIGS. 2(a) and 2(b) are a plan view and a sectional view illustrating a pattern transfer mask employed in the production process of the first embodiment of the present invention.
FIG. 2(c) is a diagram illustrating an on-wafer intensity profile of light transmitted through the pattern transfer mask of FIGS. 2(a)-2(b).
Figure 2:
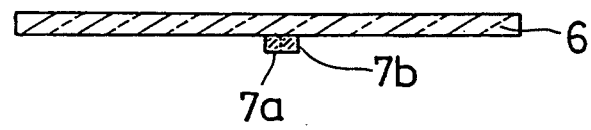
Figure 2:
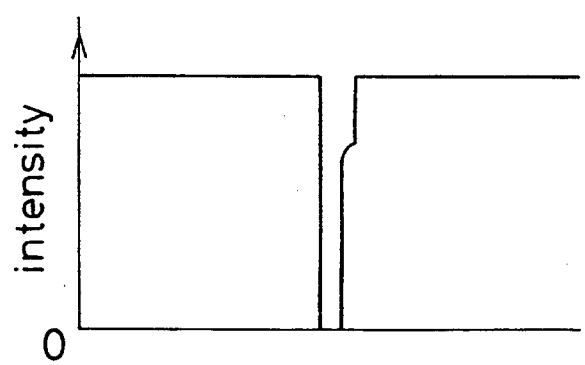

Initially, as illustrated in FIG. 1(a), an image reversal photoresist film 2 about 0.6 μm thick is deposited on a semi-insulating GaAs substrate 1 about 600 μm thick including an active region (not shown) about 5000 Å thick.

Using the gate pattern transfer mask shown in FIGS. 2(a)–2(b), the photoresist film 2 is exposed to light by a reducing projection exposure process, such as photolithography (first exposure step). Then, the photoresist film 2 is subjected to a reversal baking process and the whole surface is exposed to light (second exposure step), whereby a portion of the photoresist film 2 that is not exposed to light during the first exposure step, i.e., a portion masked with the light shielding film 7, is made soluble. The soluble portion of the photoresist film 3 is removed during development, resulting in a gate electrode photoresist pattern 2b with an aperture 3 (FIG. 2(b)). The width of the aperture 3 is 0.5~1 μm.

Since the projections 7b are present on the right side of the gate finger portion 7a of the light shielding film 7, the light intensity on a region of the wafer opposite to the projections 7b of the mask is lowered as shown in FIG. 2(c).

Therefore, in the photoresist film 2 during the first exposure step, the exposure energy applied to the portion of the photoresist film 2 opposite to the projections 7b of the mask decreases, resulting in a difference in the exposures between the upper portion and the lower portion of the photoresist film 2. When the photoresist film 2 is developed after reversal baking and the second exposure, a portion not exposed to light during the first exposure is made soluble and removed, resulting in the photoresist pattern 2b having the left side overhanging portion $2b_1$ of about 0.15 μm and the right side overhanging portion $2b_2$ of about 0.25~0.3 μm.

In the step of FIG. 1(c), using the photoresist pattern 2b as a mask, the substrate 1 is wet etched with a mixture of phosphoric acid and hydrogen peroxide or a mixture of tartaric acid and hydrogen peroxide, forming a gate recess 40 having a width of 1.5~1.55 μm and a depth of about 3000 Å.

In the step of FIG. 1(d), a gate metal, such as Al, Ti, or Au, is deposited perpendicular to the surface of the substrate 1. Thereafter, the photoresist pattern 2b and the overlying portions 5a of the gate metal are removed by a lift-off technique, forming a gate electrode 5 about 0.5 μm wide in the recess 40 (FIG. 1(e)).

According to the first embodiment of the present invention, the exposure of the photoresist film 2 is performed using the asymmetric mask pattern shown in FIGS. 2(a)–2(b) that provides an asymmetric intensity profile of the light incident on the photoresist film 2 shown in FIG. 2(c), thereby forming the photoresist pattern 2b having the asymmetric overhanging portions $2b_1$ and $2b_2$ in the aperture 3. Therefore, the gate electrode photoresist pattern 2b is produced in the relatively simple process with high precision and high reproducibility, resulting in a MESFET with a reliably offset gate electrode and a high drain breakdown voltage.

FIGS. 3(a)–3(f) are sectional views illustrating process steps in a method for producing an FET in accordance with a second embodiment of the present invention.

While in the above-described first embodiment a single-stage gate recess is employed, in this second embodiment a two-stage gate recess is employed, i.e., a second gate recess 40a is formed in the first gate recess 40.

Figure 3:
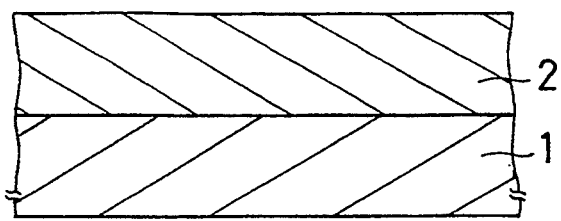
FIGS. 3(a)-3(f) are sectional views illustrating process steps in a method for producing an FET in accordance with a second embodiment of the present invention.
Figure 3:
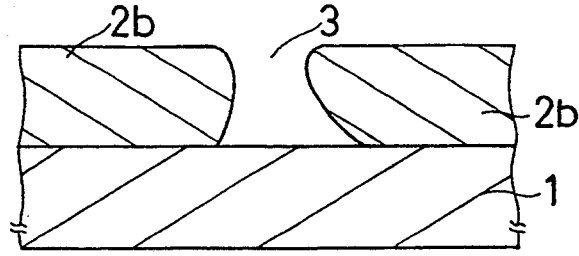
Figure 3:
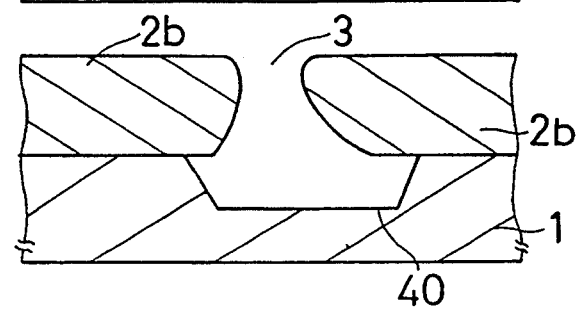
Figure 3:
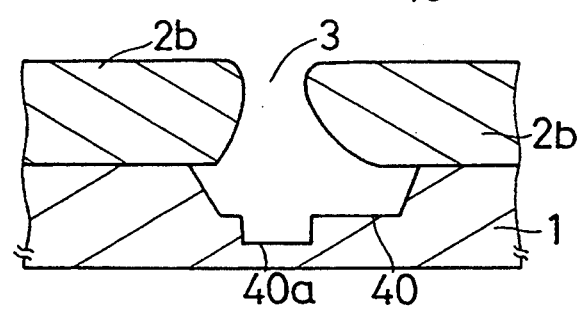
Figure 3:
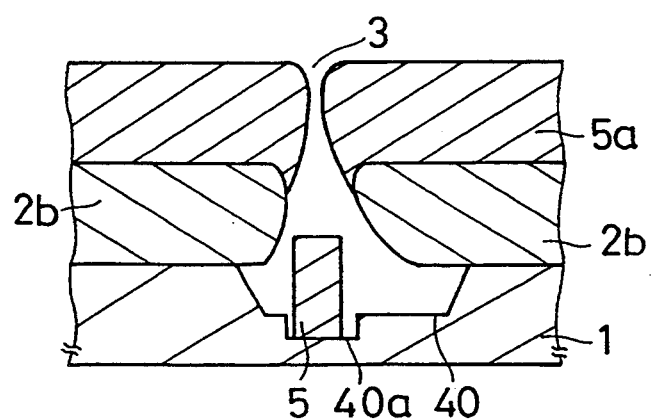
Figure 3:
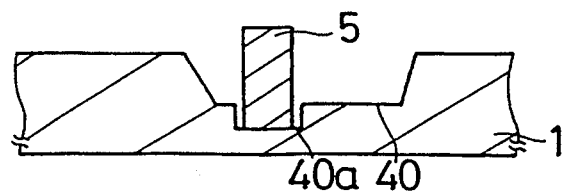

The steps illustrated in FIGS. 3(a)–3(c) are identical to those already described with respect to FIGS. 2(a)–2(c) and, therefore, do not require repeated description.

After forming the first gate recess 40 as shown in FIG. 3(c), a portion of the substrate 1 is dry etched from the bottom surface of the first gate recess 40 using the photoresist pattern 2b as a mask, forming the second gate recess 40a (FIG. 3(d)). The second gate recess 40a has a width of about 0.6 μm and a depth of about 1000 Å.

In the step of FIG. 3(e), a gate metal, such as Al, Ti, or Au, is deposited perpendicular to the surface of the substrate 1, and the photoresist pattern 2b and the overlying portions 5a of the gate metal are removed by a lift-off technique, forming a gate electrode 5 0.5 μm wide in the second recess 40a (FIG. 3(f)).

This two-stage gate recess structure increases the gate breakdown voltage in addition to the effects of the first embodiment of the present invention.

While in the above-described first and second embodiments the gate pattern transfer mask shown in FIGS. 2(a)–2(b) is employed for producing the gate electrode photoresist pattern 2b with the asymmetric overhanging portions $2b_1$ and $2b_2$ in the aperture 3, other masks described below may be employed with the same effects as described above.

Figure 4:
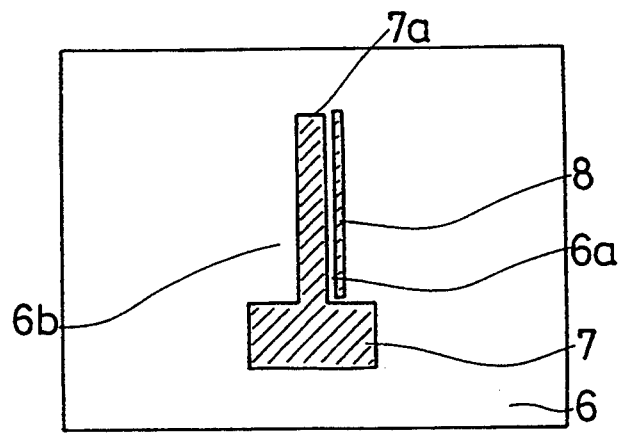
FIG. 4 is a plan view illustrating a pattern transfer mask in accordance with a third embodiment of the present invention.

FIG. 4 is a plan view illustrating a gate pattern transfer mask according to a third embodiment of the present invention. In this third embodiment, an auxiliary pattern 8 comprising Cr or the like is disposed on the right side of the gate finger portion 7a of the light shielding film 7 parallel to and spaced apart from the gate finger portion 7a. The width of the auxiliary pattern 8 is 1 μm and the space 6a between the gate finger portion 7a and the auxiliary pattern 8 is 1 μm.

Since light incident on the mask of FIG. 4 is diffracted at the adjacent edges of the auxiliary pattern 8 and the gate finger portion 7a, the intensity of the light applied to a part of the photoresist film 2 opposite the space 6a of the mask is lowered, resulting in the asymmetric intensity profile on the photoresist film 2 shown in FIG. 2(c).

Figure 5:
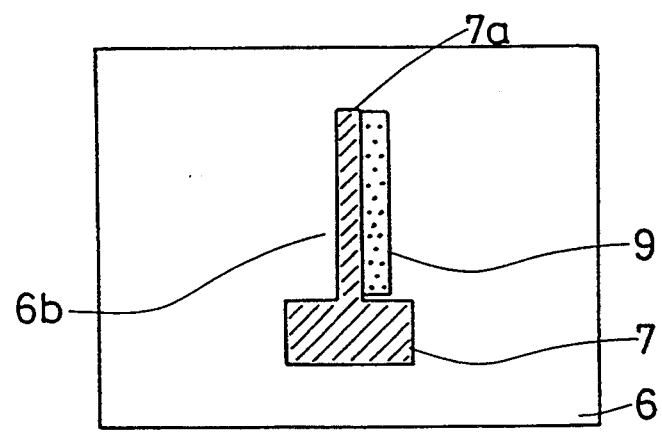
FIG. 5 is a plan view illustrating a pattern transfer mask in accordance with a fourth embodiment of the present invention.

FIG. 5 is a plan view illustrating a gate pattern transfer mask according to a fourth embodiment of the present invention. In this fourth embodiment, an opaque region 9 about 2 μm wide is formed on the glass substrate 6 along the right side of the gate finger portion 7a of the light shielding film 7. Preferably, the opaque region 9 is formed by selectively implanting Ga ions into that region of the glass substrate 6 using a focused ion beam.

When the photoresist film 2 is exposed to light transmitted through the mask of FIG. 5, since the intensity of the light applied to a part of the photoresist film 2 opposite the opaque region 9 of the mask is lowered, the asymmetric intensity profile of FIG. 2(c) is attained on the photoresist film 2.

Figure 6:
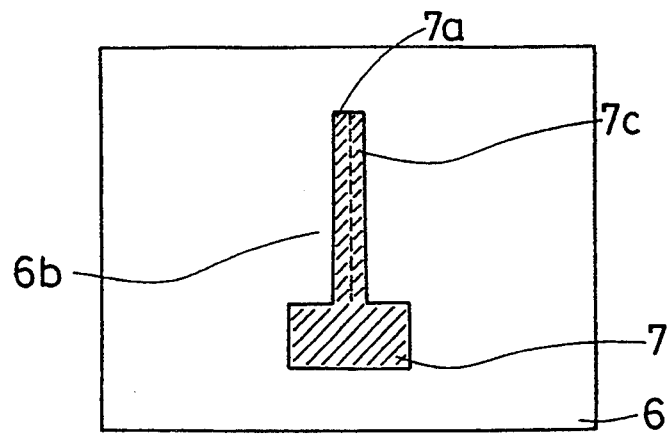
FIGS. 6(a) and 6(b) are a plan view and a sectional view illustrating a pattern transfer mask in accordance with a fifth embodiment of the present invention.
Figure 6:
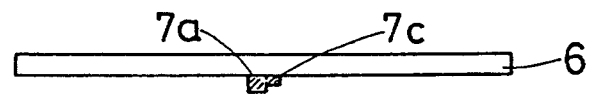

FIGS. 6(a) and 6(b) are a plan view and a sectional view illustrating a gate pattern transfer mask according to a fifth embodiment of the present invention. In this fifth embodiment, the gate finger portion 7a of the light shielding film 7 has a step portion 7c on its right side. The step portion 7c is about 2 μm wide and about 500 Å thick.

Usually the light shielding film 7 comprising Cr completely shuts off light because it has a thickness of about 1000 Å. The step portion 7c about 500 Å thick has the transmissivity of about half of the transmissivity of the glass substrate 6. Therefore, the asymmetric intensity profile shown in FIG. 2(c) is attained on the photoresist film.

Figure 7:
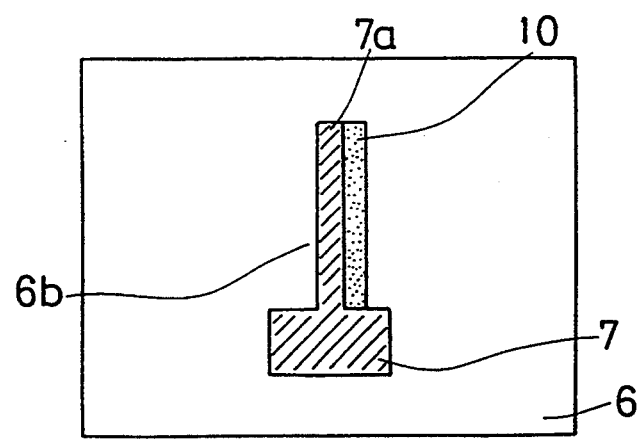
FIGS. 7(a) and 7(b) are a plan view and a sectional view illustrating a pattern transfer mask in accordance with a sixth embodiment of the present invention.
Figure 7:
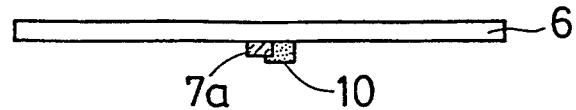

FIGS. 7(a) and 7(b) are a plan view and a sectional view illustrating a gate pattern transfer mask according to a sixth embodiment of the present invention. In this sixth embodiment, a semi-transparent film 10 is adhered to the right side of the light shielding film 7a so that a portion of the film 10 lies on the light shielding film 7a. The semi-transparent film 10 has a width of about 2 μm except the overlying portion and does not invert the phase of incident light. Preferably, the semi-transparent film 10 comprises photoresist.

The transmissivity of the semi-transparent film 10 is made about half of the transmissivity of the glass substrate 6 by appropriately selecting the material and the thickness of the film 10. Also in this case, the asymmetric intensity profile shown in FIG. 2(c) is attained on the photoresist film 2.

Figure 10:
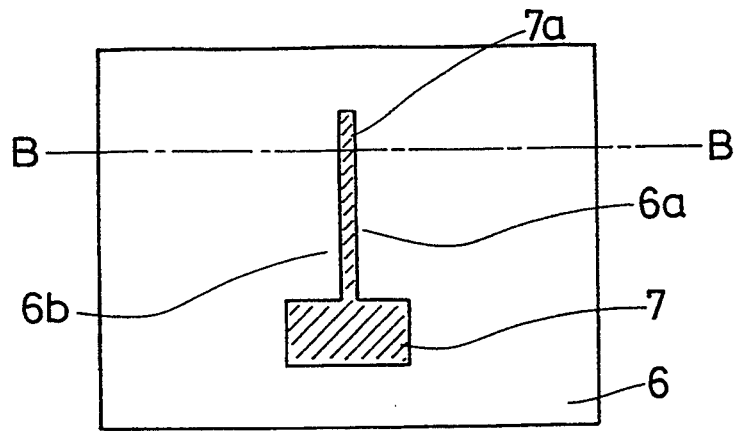
FIGS. 10(a) and 10(b) are a plan view and a sectional view illustrating a pattern transfer mask employed in the production process of FIGS. 9(a)–9(f)
FIG. 10(c) is a diagram illustrating an on-wafer intensity profile of light transmitted through the pattern transfer mask.
FIG. 10(d) is a diagram illustrating the relation between the exposure energy and the overhang.
Figure 10:
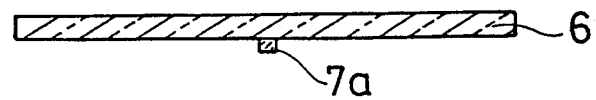
Figure 10:
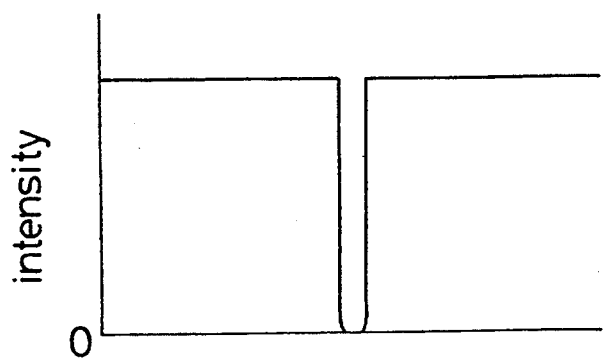
Figure 10:
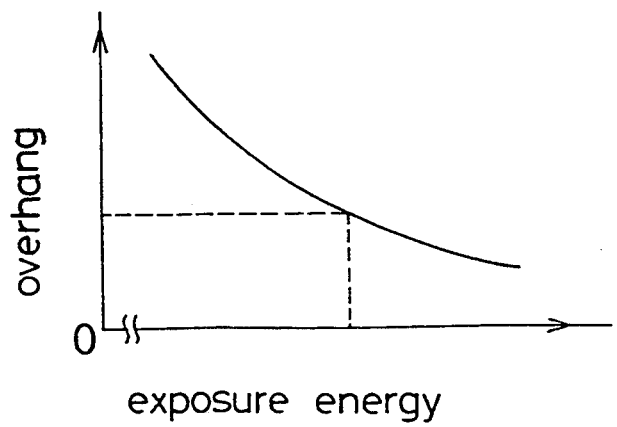

FIGS. 8(a)–8(g) are sectional views illustrating process steps in a method for producing a MESFET with high drain breakdown voltage. In this method, the conventional gate pattern transfer mask shown in FIGS. 10(a)–10(b) is used in the exposure process.

Figure 9:
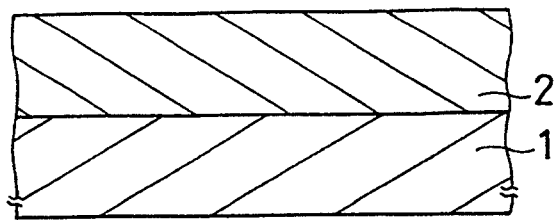
FIGS. 9(a)–9(f) are sectional views illustrating process steps in a method for producing an FET in accordance with the prior art.
Figure 9:
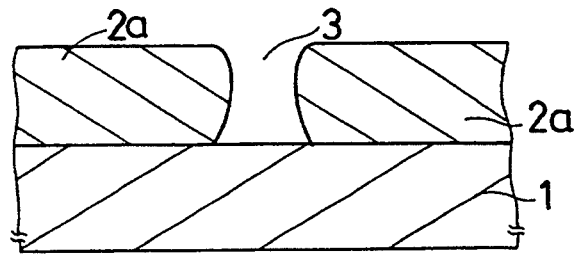
Figure 9:
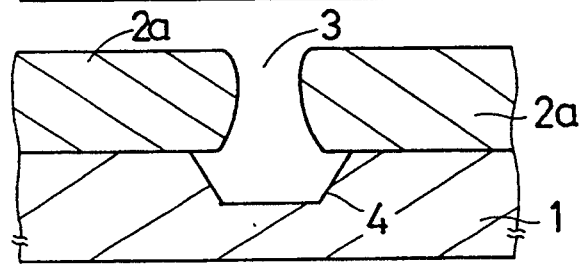
Figure 9:
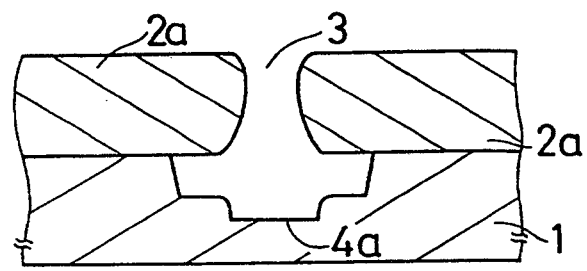
Figure 9:
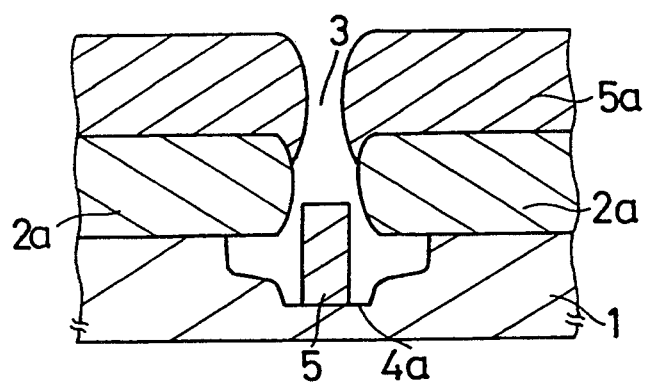
Figure 9:
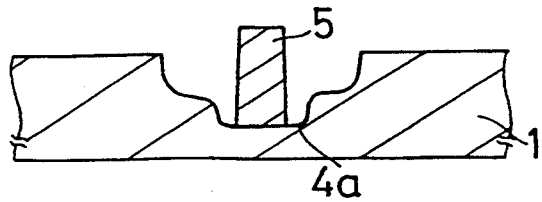

The steps illustrated in FIGS. 8(a)–8(b) are identical to those already described with respect to FIGS. 9(a)–9(c) and, therefore, do not require repeated description.

After the formation of the first gate recess 4, the photoresist pattern 2a with the aperture 3 is subjected to development again (second development). The lower edge portions 21 of the photoresist pattern 2a are easily dissolved after the reversal baking process because light is not significantly absorbed in these portions during the first exposure step. Therefore, these portions 21 are selectively removed during the second development and the spacing between opposite overhanging portions of the photoresist pattern 2a in the aperture 3 is increased by 0.1~0.15 μm (FIG. 8(d)).

Using the photoresist pattern 2a as a mask, the substrate 1 is wet etched to increase the width of the first gate recess 4 and to form a second gate recess 4a in the first gate recess 4 (FIG. 8(e)). The width of the first gate recess 4 after the wet etching is 1.5~1.55 μm. The width and depth of the second gate recess 4a are about 0.6 μm and 1000 Å, respectively.

Thereafter, a gate metal 5a, such as Al, Ti, or Au, is deposited perpendicular to the surface of the substrate 1

What is claimed is:

1. A method for producing a field effect transistor comprising:
   depositing a positive photoresist on a surface of a semiconductor substrate;
   exposing said positive photoresist to light having an asymmetrical intensity profile relative to a gate electrode formation region of the semiconductor substrate where a gate electrode is to be formed;
   converting the positive photoresist into a negative photoresist and developing the negative photoresist to form a photoresist pattern having an aperture opposite the gate electrode formation region of the substrate and asymmetrical overhanging portions at the aperture;
   wet etching the semiconductor substrate using the photoresist pattern as a mask to form a recess in the semiconductor substrate; and
   depositing a gate metal using the photoresist pattern as a mask to form a gate electrode in the recess.

2. The method of claim 1 including forming a second recess in the recess by dry etching the semiconductor substrate using the pattern as a mask before depositing the gate metal.

3. The method of claim 1 wherein said positive photoresist is an image reversal photoresist.

4. A method for producing a field effect transistor comprising:
   depositing a positive photoresist on a surface of a semiconductor substrate;
   exposing a region of the positive photoresist opposite a gate electrode formation region of the substrate where a gate electrode is to be formed to light;
   converting the positive photoresist into a negative photoresist and developing the negative photoresist to form a photoresist pattern having an aperture opposite the gate electrode formation region of the substrate and symmetrical overhanging portions at the aperture;
   wet etching the semiconductor substrate using the photoresist pattern as a mask to form a first recess in the semiconductor substrate leaving overhanging portions of the photoresist pattern at the aperture;

developing the photoresist pattern to increase the spacing between the overhanging portions at the aperture;

using the photoresist pattern as a mask, wet etching the semiconductor substrate to increase the width of the first recess and to form a second recess in the first recess; and depositing a gate metal using the photoresist pattern as a mask to form a gate electrode in the second recess.

5. The method of claim 4 wherein said positive photoresist is an image reversal photoresist.

* * * * *